United States Patent
Hart

(10) Patent No.: US 10,021,779 B1
(45) Date of Patent: Jul. 10, 2018

(54) QUICK RESPONSE PARTICLE DAMPER FOR PRINTED CIRCUIT BOARDS AND PLANAR SURFACES

(71) Applicant: TopLine Corporation, Irvine, CA (US)

(72) Inventor: Martin B. Hart, Irvine, CA (US)

(73) Assignee: TopLine Coporation, Irvine, CA (US)

(*) Notice: Subject to any disclaimer, the term of this patent is extended or adjusted under 35 U.S.C. 154(b) by 0 days.

(21) Appl. No.: 15/824,915

(22) Filed: Nov. 28, 2017

(51) Int. Cl.
  *H05K 1/00* (2006.01)
  *H05K 7/14* (2006.01)
  *H01B 1/00* (2006.01)
  *H05K 1/02* (2006.01)

(52) U.S. Cl.
  CPC ... *H05K 1/0271* (2013.01); *H05K 2201/2045* (2013.01)

(58) Field of Classification Search
  CPC .................... H05K 1/0271; H05K 2201/2045
  USPC .......................................................... 174/135
  See application file for complete search history.

(56) References Cited

U.S. PATENT DOCUMENTS

| | | | |
|---|---|---|---|
| 2,667,237 A | 1/1954 | Rabinow | |
| 3,083,259 A * | 3/1963 | Wells | H05K 1/0271 174/255 |
| 3,141,523 A | 7/1964 | Dickie | |
| 3,631,297 A * | 12/1971 | Conner | H05K 1/0271 174/255 |
| 3,871,496 A | 3/1975 | Wigal | |
| 4,053,943 A * | 10/1977 | Galvin | H05K 1/0271 188/266 |
| 4,118,861 A * | 10/1978 | Palmisano | H05K 3/284 174/521 |
| 4,504,044 A | 3/1985 | Shtarkman | |
| 4,566,231 A * | 1/1986 | Konsevich | E04B 1/98 181/208 |

(Continued)

FOREIGN PATENT DOCUMENTS

| | | |
|---|---|---|
| CN | 101576138 A | 11/2009 |
| CN | 105937573 | 9/2016 |
| JP | 2003-194142 A | 7/2003 |

*Primary Examiner* — Timothy Thompson
*Assistant Examiner* — Rhadames J Alonzo Miller
(74) *Attorney, Agent, or Firm* — Knobbe, Martens, Olson & Bear LLP

(57) ABSTRACT

An apparatus and system for attaining quick response to vibration damping of a printed circuit board (PCB) or other planar surface utilizing a defined travel displacement of a single spherical tungsten (or other material) ball in a single or plurality of sealed spherical chambers in a particle impact damper (PID). The single spherical tungsten (or other material) ball is not weighed down, constrained, encumbered or influenced by other spherical balls within the chamber; accordingly, providing unrestricted freedom for the ball to quickly respond at the first occurrence of excessive vibrational acceleration over 1G. The structure of a single spherical particle within a sealed spherical chamber also provides a path of minimum distance for the ball to travel before colliding with the ceiling or side walls of the PID chamber. A plurality of spherical chambers can be arranged in a variety of patterns within the PID housing such as desired. The PID housing can be any shape such as a cube, a rectangular cuboid, a cylinder, sphere, triangular tetrahedron, triangular prism, polygon, toroid or any combination of shapes.

21 Claims, 12 Drawing Sheets

(56) References Cited

U.S. PATENT DOCUMENTS

| | | | |
|---|---|---|---|
| 4,872,937 A * | 10/1989 | Gouldy | C09J 7/0242 156/313 |
| 5,136,470 A * | 8/1992 | Sheridon | H05K 1/0271 174/255 |
| 5,426,568 A * | 6/1995 | Lamers | H05K 1/0271 174/254 |
| 5,453,580 A * | 9/1995 | Franke | H05K 1/0271 174/250 |
| 5,552,209 A * | 9/1996 | McCutcheon | H05K 1/0271 428/209 |
| 5,691,037 A * | 11/1997 | McCutcheon | B32B 3/06 428/172 |
| 5,914,864 A * | 6/1999 | MacDonald, Jr. | F16F 15/08 206/706 |
| 5,945,643 A * | 8/1999 | Casser | B29C 70/086 181/208 |
| 5,958,556 A * | 9/1999 | McCutcheon | H05K 1/0271 174/161 R |
| 6,362,969 B1 * | 3/2002 | Furst | F42C 19/02 248/562 |
| 6,454,063 B1 | 9/2002 | Osterberg et al. | |
| 6,459,211 B1 * | 10/2002 | Wang | H05B 33/02 315/169.3 |
| 6,547,049 B1 * | 4/2003 | Tomlinson | F01D 25/04 188/379 |
| 6,557,752 B1 | 5/2003 | Iannuzzelli | |
| 6,643,221 B1 | 11/2003 | Hsu et al. | |
| 7,461,728 B2 | 12/2008 | Huston et al. | |
| 8,291,567 B1 | 10/2012 | Keenan et al. | |
| 8,985,935 B2 | 3/2015 | Tan | |
| 9,521,753 B1 * | 12/2016 | Hunt | B65B 5/08 |
| 2002/0121414 A1 * | 9/2002 | Barcock | F16F 7/015 188/268 |
| 2003/0013322 A1 | 1/2003 | Choy et al. | |
| 2006/0077641 A1 * | 4/2006 | Lavergne | H05K 1/0271 361/752 |
| 2006/0175169 A1 | 8/2006 | Or et al. | |
| 2006/0180420 A1 * | 8/2006 | Rongong | F16F 7/01 188/378 |
| 2007/0068756 A1 * | 3/2007 | Huston | F16F 7/1005 188/378 |
| 2008/0003846 A1 * | 1/2008 | Miyagawa | H05K 1/0231 439/71 |
| 2008/0246372 A1 * | 10/2008 | Melz | F16F 15/005 310/332 |
| 2009/0122505 A1 * | 5/2009 | Lu | H05K 1/0271 361/809 |
| 2009/0258168 A1 * | 10/2009 | Barcock | B22F 3/1055 427/596 |
| 2010/0320046 A1 | 12/2010 | Provost | |
| 2011/0100667 A1 * | 5/2011 | Hardie | H01B 7/189 174/24 |
| 2011/0108312 A1 * | 5/2011 | Becze | H05K 3/325 174/258 |
| 2012/0024646 A1 | 2/2012 | Tsugihashi | |
| 2012/0168271 A1 | 7/2012 | Ryaboy | |
| 2014/0284086 A1 * | 9/2014 | Iwase | F16F 1/3605 174/255 |
| 2017/0064811 A1 * | 3/2017 | Li | H01G 4/224 |
| 2017/0335915 A1 * | 11/2017 | Nyboer | F16F 7/015 |

\* cited by examiner

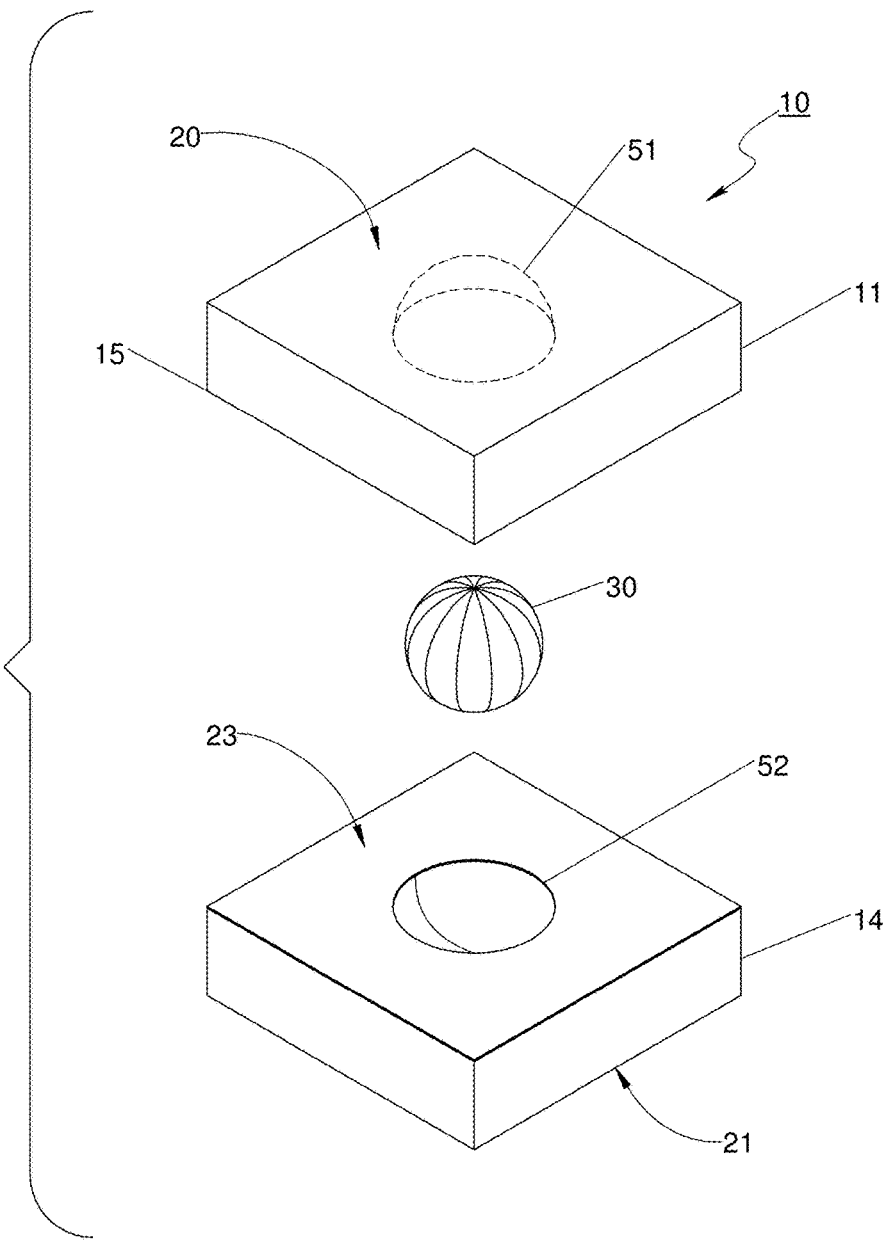

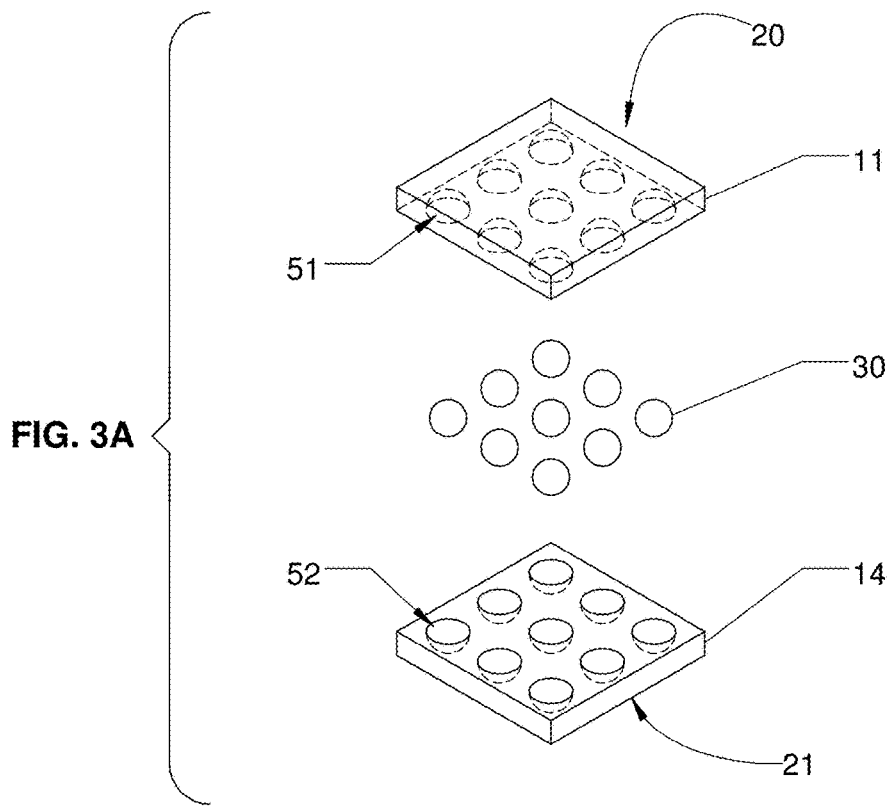
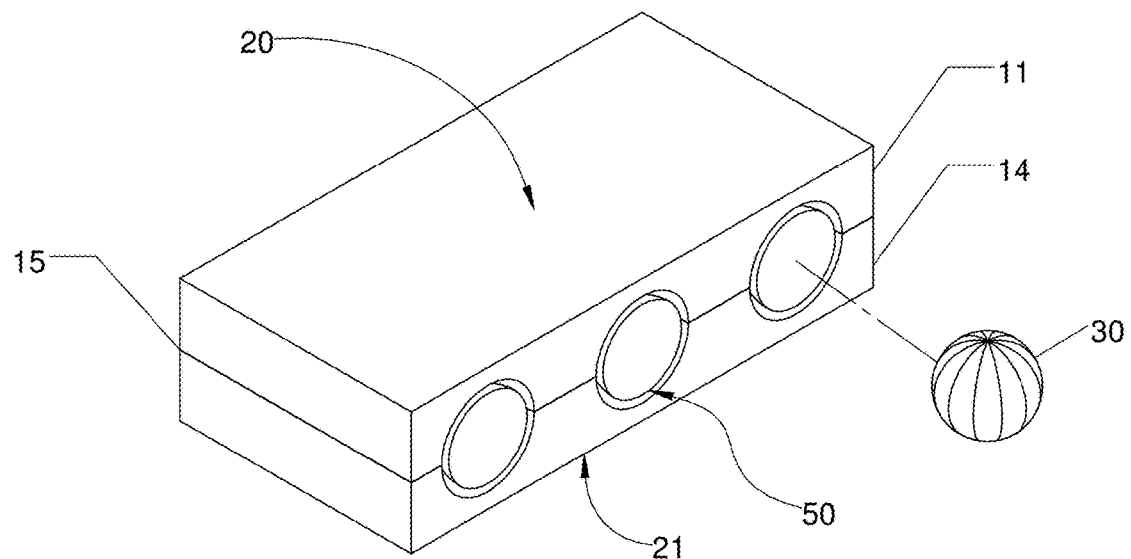

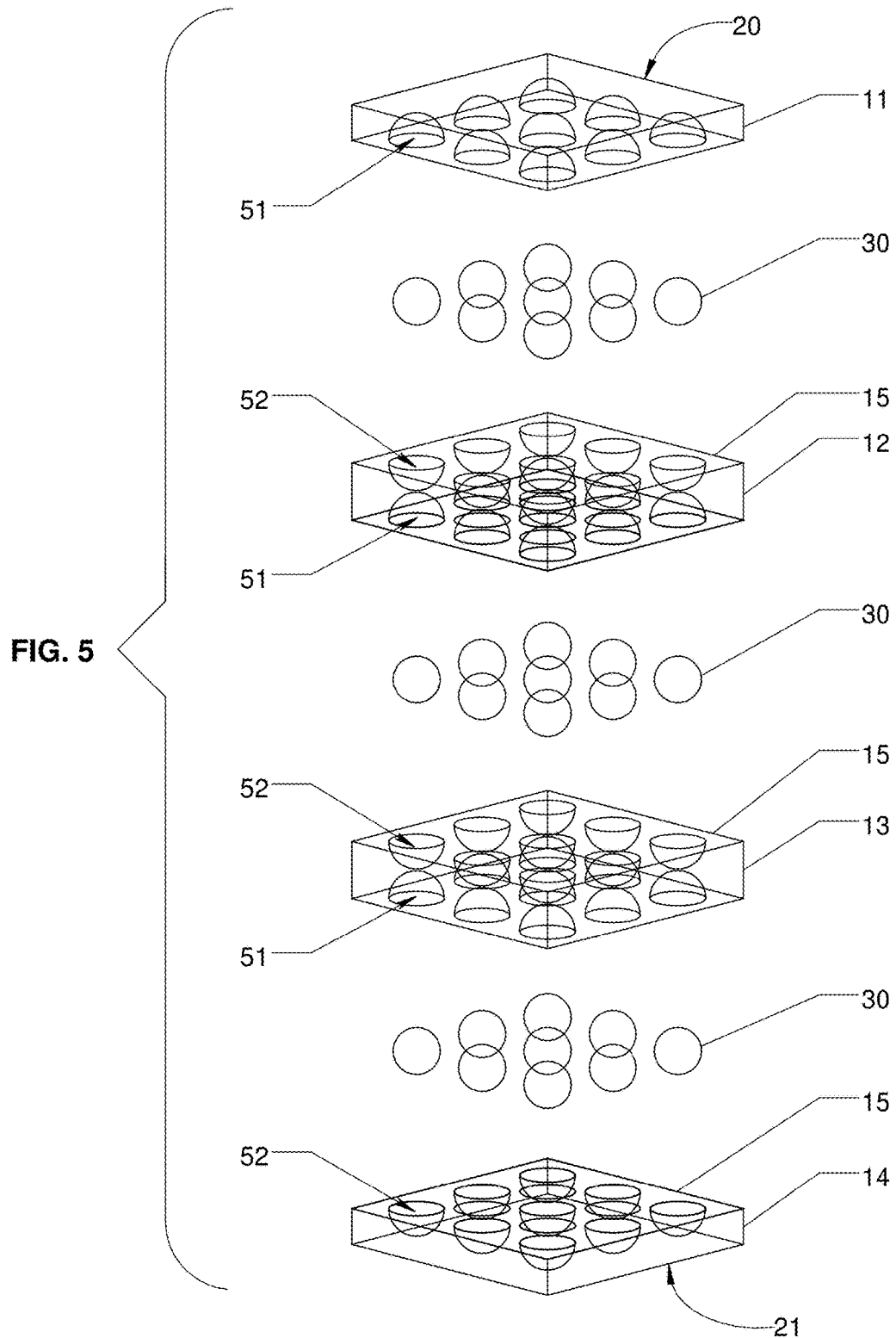

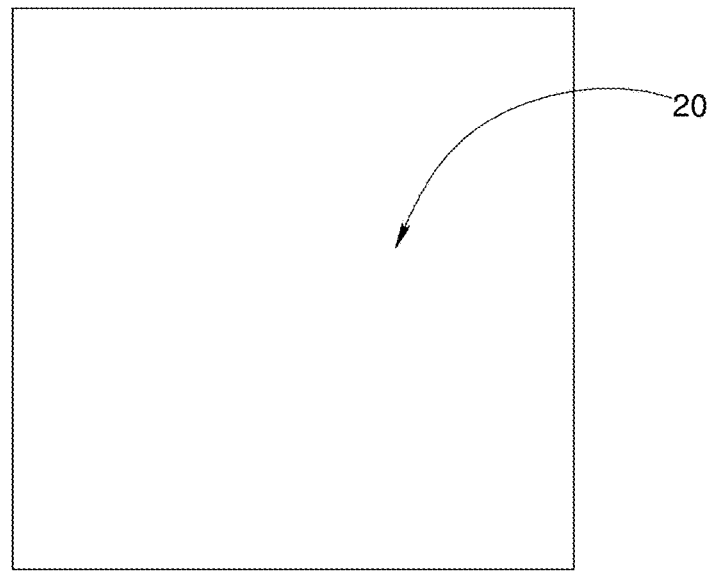
FIG. 6A
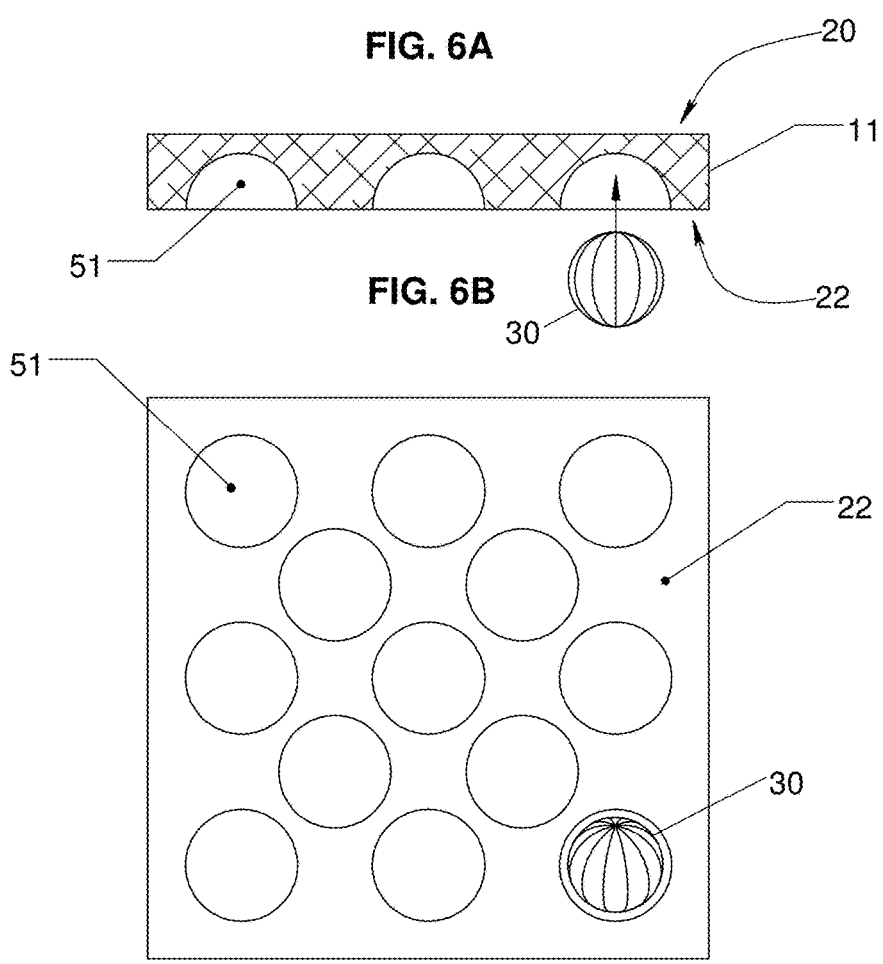
FIG. 6B
FIG. 6C

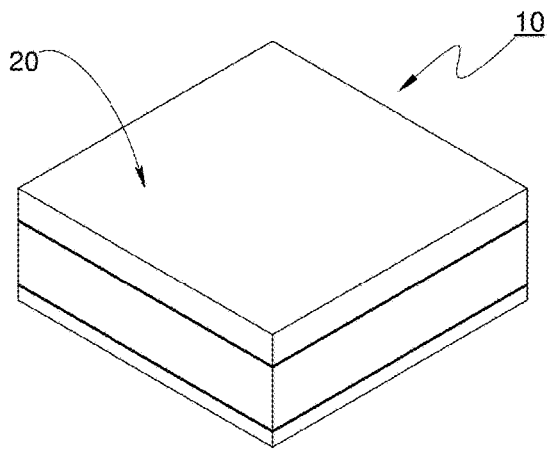
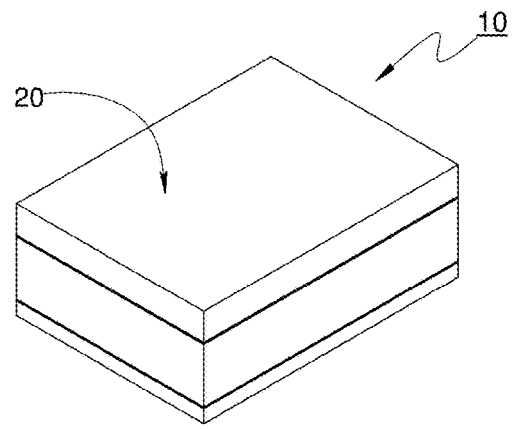
FIG. 9A          FIG. 9B
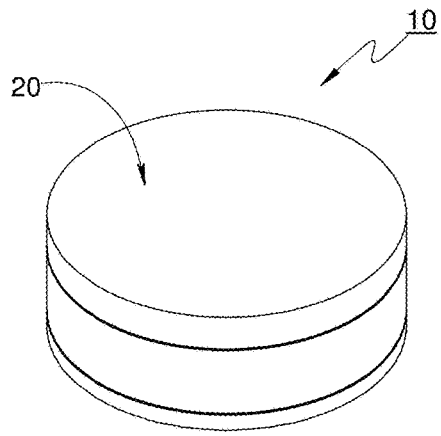
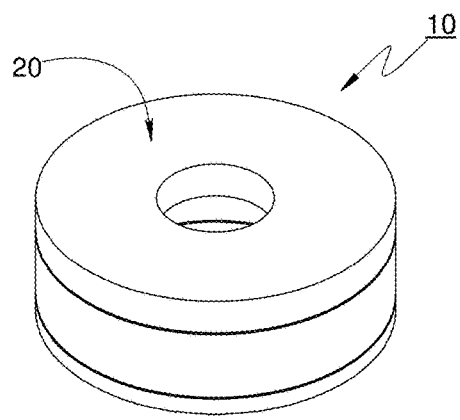
FIG. 9C          FIG. 9D

QUICK RESPONSE PARTICLE DAMPER FOR PRINTED CIRCUIT BOARDS AND PLANAR SURFACES

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The present invention relates generally to a quick response vibration damper for planar surfaces, such as printed circuit boards (PCBs), and more particularly to an apparatus containing one or more tungsten particles (e.g., spherical balls) or other ballast materials housed inside of one or more sealed storage chambers.

Description of the Related Art

Printed circuit board (PCB) assemblies populated with electrical and electronic components experience fatigue, factures, cracks and other general weaknesses after being subjected to excessive vibration environments, especially at the board's fundamental frequency. The fundamental frequency is sometimes referred to as the fundamental mode.

Under excessive vibration conditions, the populated circuit board assembly with components will bend in an uncontrolled manner at frequencies less than hundreds or as much as thousands of times per second. The mechanical and electrical interconnections between the components and the circuit board under vibrating conditions are susceptible to breakage, resulting in catastrophic failure after repeatedly excessive bending, over a period of time lasting perhaps less than a minute or more than several years.

It is preferred to reduce the strength of potentially damaging vibrations in order to extend the life of the PCB assembly. Various mechanisms have been used to mitigate damage caused by excessive vibration, such as by increasing the stiffness of the board, or by using various absorption materials such as foam or rubber bumpers, also known as snubbers.

Ronald Allen Hunt teaches that vibration can be dampened by using a closed metal cylinder container filled to approximately 90% of capacity with a plurality of metal or tungsten balls, by coupling said container to the surface of a populated circuit card, as disclosed in U.S. Pat. No. 9,521,753 B1. After filling the metal cylinder container with an optimal mass of tungsten balls, the container is closed and sealed to prevent the contents from escaping. Such filled container is known in the art as a particle damper (PD), also known as a particle impact damper (PID).

In the prior art, when the printed circuit board starts vibrating, the plurality of tungsten particles inside the cavity of the PID (attached to the surface of the printed circuit board) begins moving and colliding with the walls of the PID cavity storage tank and with each other. This process dissipates energy from the vibrating printed circuit board through nonlinear loss mechanisms, including friction and the exchange of momentum along with the transfer of kinetic energy to heat. When the movement of the plurality of tungsten inside the PID cavity storage tank is reversed by the oscillation of the printed circuit board, the tungsten particles slam into the opposite wall and their energy transfer in the opposite direction of the moving tungsten ball's energy. This results in a lower displacement of the printed circuit board where the cavity storage tank of the PID is attached.

In the prior art, Hunt states that the mass of the plurality of tungsten balls contained inside the sealed PID is approximately equal to 7% of the combined mass of the printed circuit board populated with components mounted on said board.

In the prior Art, the PID may be coupled to the surface of the printed circuit board generally at the geographical center of the board. Alternatively, the PID may be located on the board near the area experiencing the strongest vibration.

In the prior art, the PID is described as a closed, cylindrical metal container selected from a group consisting of aluminum and steel that is coupled to the surface of the circuit board by an adhesive material.

In the prior art, the conductive properties of a metal PID container particularly raises special concerns to avoid electrically shorting the PID housing to the highway of circuit traces inherently found on the surface of the printed circuit board.

In the prior art, the mass weight of the tungsten balls are clumped together in a single cylindrical chamber, each ball resting on top of another ball, effectively weighing down and constraining the remaining tungsten balls and preventing their instantaneous movement at the onset of a vibrational event.

In the prior art, at the onset of a vibration event, the tungsten balls at the top of the cylindrical chamber are the first to move, while the mass of balls at the bottom of the chamber sit until they are free to move.

In the prior art, the clump mass of tungsten balls experiences a timed release as rows of balls move, thus delaying the immediate response of the PID to perform in an instantaneous manner.

In the prior art, the tungsten balls at the top of the chamber have less distance to travel before colliding with the ceiling of the chamber, while the balls at the bottom of the chamber must travel a longer distance before impacting with the ceiling of the chamber.

In the prior art, the tungsten balls along the perimeter of the chamber have less distance to travel before colliding with the side walls of the chamber, while the balls in the center of the chamber must travel a longer distance before colliding with the side walls of the chamber.

In the prior art, the PID housing is a closed cylindrical structure with a flat floor, flat ceiling and tubular shaped straight side walls positioned at right angles to the floor and ceiling of the storage chamber.

In the prior art, the tungsten balls inside the PID housing can only strike a flat floor, a flat ceiling, straight side walls or another tungsten ball inside of the closed end cylindrical storage chamber.

In the prior art, the heavy clump mass of a plurality of tungsten balls may immobilize a portion of the balls inside the storage chamber rendering their usefulness ineffective to the desired performance of the PID in an instantaneous manner.

SUMMARY

Accordingly, there is a need for a better system to allow a quicker response of the tungsten balls or particles (e.g., spheres) made of other materials inside the particle impact damper (PID) upon the instantaneous onset of a vibrational response.

In accordance with one aspect of the invention, an apparatus and method is provided to minimize the time response (e.g., delay) of the tungsten balls or other materials (e.g., spheres) inside a s storage chamber (e.g., spherically shaped storage chamber) before colliding with the ceiling, floor or side walls of the PID storage chamber.

In accordance with another aspect of the invention, an apparatus and method is provided to reduce the distance each particle (e.g., ball or sphere made of tungsten or other material) must travel inside the storage chamber before colliding with the ceiling or side walls of the PID storage chamber.

In accordance with another aspect of the invention, an apparatus and method is provided that places a single particle (e.g., ball or sphere made of tungsten or other material) inside a single storage chamber (e.g., spherically shaped storage chamber) in the PID. In accordance with another aspect, the apparatus includes a plurality of particles (e.g., balls or spheres made of tungsten or other materials), each particle placed inside a separate storage chamber (e.g., spherically shaped storage chamber) of the PID.

In accordance with another aspect of the invention, an apparatus and method is provided that permits a spherically shaped particle (e.g., ball or sphere made of tungsten or other materials) of any diameter or mass, as desired.

In accordance with another aspect of the invention, an apparatus and method is provided that permits a single or plurality of spherically shaped storage chambers of any diameter inside the PID, as desired.

In accordance with another aspect of the invention, an apparatus and method is provided that permits a single or plurality of spherically shaped storage chamber(s) in the PID housing of any shape such as a cube, a rectangular cuboid, a cylinder, a sphere, a triangular tetrahedron, a triangular prism, a polygon, a toroid or any combination of shapes.

In accordance with another aspect of the invention, an apparatus and method is provided that permits a plurality of spherically shaped storage chamber(s) to be arranged in the PID housing of any pattern such as square packing, hexagonal packing, concentric radial packing, randomly packed, or any combination of patterns.

In accordance with another aspect of the invention, an apparatus and method is provided that permits a plurality of spherically shaped storage chambers to be arranged inside the PID housing in a single elevation plane, or stacked in a plurality of elevation planes.

In accordance with another aspect of the invention, an apparatus and method is provided that permits a plurality of spherically shaped storage chambers to be arranged inside the PID housing in a linear pattern or staggered pattern.

In accordance with another aspect of the invention, an apparatus and method is provided that permits a plurality of spherically shaped storage chambers to be arranged inside the PID housing in a single or plurality of vertical plane or a single or plurality of horizontal planes, or any combination thereof.

In accordance with another aspect of the invention, an apparatus and method is provided that permits the PID housing to be of any volumetric size as desired.

In accordance with another aspect of the invention, an apparatus and method is provided comprising a PID housing of at least two-piece construction consisting of a removable or non-removable top cover plate and a removable or non-removable bottom plate with mating storage chambers (e.g., semicircular spherical cavity storage chambers).

Alternatively, in accordance with another aspect of the invention, an apparatus and method is provided comprising a PID housing with a plurality of spherical cavity storage chambers arranged in a plurality of stacked layers as desired (e.g., such as a honeycomb or cordwood pattern) with a removable or non-removable top cover plate and a removable or non-removable bottom plate.

In accordance with another aspect of the invention, an apparatus and method is provided that permits the PID housing to be of any material (e.g., metal, plastic, ceramic) or any combination as desired.

In accordance with another aspect of the invention, an apparatus and method is provided that permits the PID housing to be coupled to a planar surface such as a printed circuit board assembly (PCBA) in a variety of methods such as adhesively connecting with glue or epoxy, welding, soldering pad to pad, reflowing solder balls arranged in a ball grid array (BGA) pattern, axial or radial wires, clamps, screw fasteners, non-screw fasteners, sockets or any combination as desired.

These and other objects, features and advantages of the present invention will become more apparent from the detailed description of the preferred embodiment when read in conjunction with the drawings.

BRIEF DESCRIPTION OF THE DRAWINGS

FIG. 2C is an exploded view of FIG. 2B.

FIG. 3A is an exploded view of another embodiment of a PID with a plurality of particles individually stored in a plurality of sealed spherical chambers in the PID constructed of two sections.

FIG. 3B is a cross-sectional view of FIG. 3A.

FIG. 5 is an exploded view of the apparatus of FIG. 4A.

FIG. 6A is a top view of the top section of the apparatus of FIG. 4A.

FIG. 6B is a front facing sectional view of the apparatus of FIG. 6A.

FIG. 6C is the bottom view of the top section of FIG. 6A with a plurality of particles arranged in a staggered (e.g., hexagonal) pattern.

FIG. 9A is square shaped PID housing.

FIG. 9B is a rectangular shaped PID housing.

FIG. 9C is a cylindrical shaped PID housing.

FIG. 9D is a toroidal shaped PID housing.

DETAILED DESCRIPTION

Figure 1:
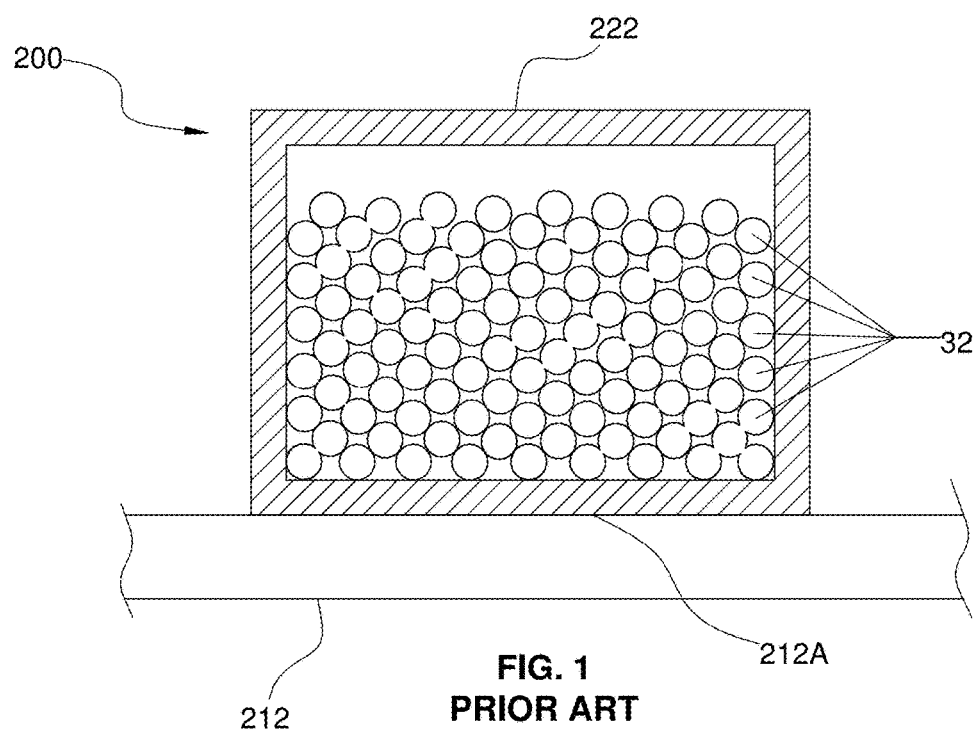
FIG. 1 is a front cross-sectional view of the prior art showing a particle impact damper (PID) with a plurality of tungsten balls filled to approximately 90% that is sealed in a single closed metal cylindrical container and adhesively coupled to the geometric center on the surface of a printed circuit board (PCB).

FIG. 1 shows an existing particle impact damper (PID) 200 with a single closed metal cylindrical container 222 filled approximately 90% with a plurality of tungsten balls 32, the container 222 adhesively coupled to the geometric center 212A surface of a printed circuit board (PCB) 212.

FIGS. 2A, 2B, 2C 2D and 2E show one embodiment of a particle impact damper (PID), generally designated at 10, that holds a single particle 30. Optionally, the particle 30 can be made of tungsten. Alternatively, the particle 30 can be made of other suitable materials (e.g., other suitable metals, ceramics, powders, liquids and plastics, etc.). Optionally, the particle 30 can be spherical in shape. Alternatively, the particle 30 can have other suitable shapes (e.g., ovoid, diamond, cylindrical, etc.).

Figure 2A:
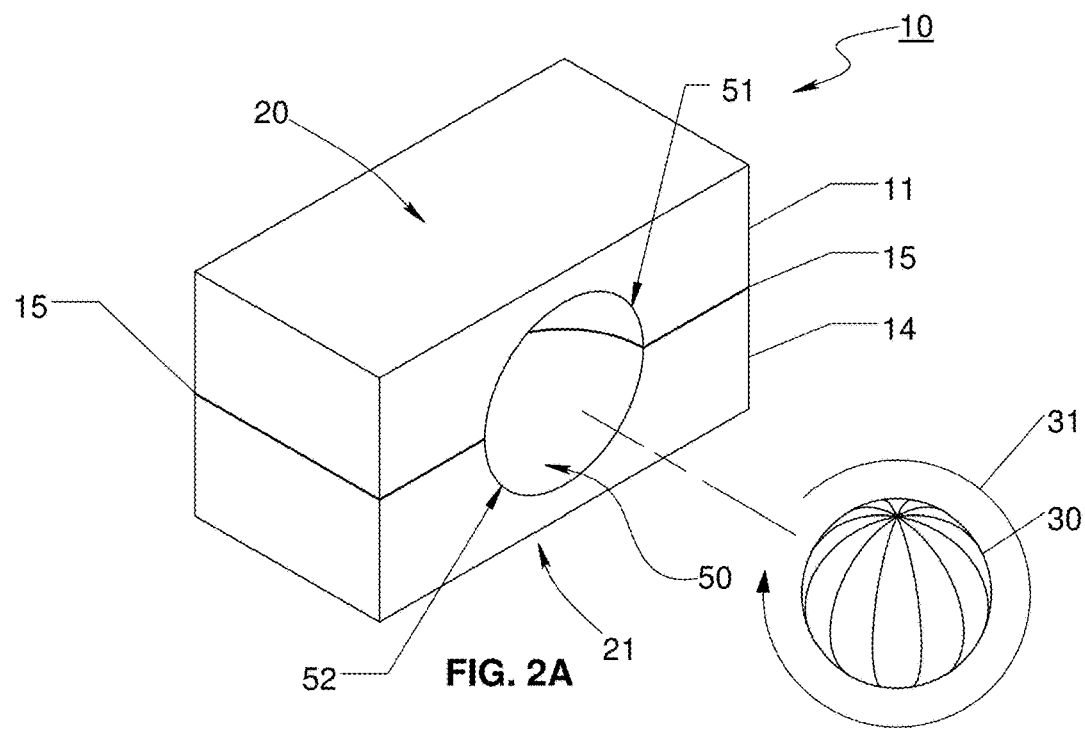
FIG. 2A is a cross-sectional view of one embodiment of a particle impact damper (PID) with a single particle that is sealed inside a single chamber in the PID container constructed of two sections.

Optionally, the particle 30 can be stored inside a single spherical chamber 50 as shown in FIG. 2A. Optionally, the chamber 50 can have an effective diameter 35 (e.g., measured from 35a to 35b) that is larger than the effective diameter 34 (e.g., measured from 34a to 34b) of the particle 30 as shown in FIGS. 2D and 2E.

Alternatively, a plurality of particles 30 (e.g., spherical balls) can be individually stored in a plurality of sealed chambers (e.g., spherical chambers), as shown in FIGS. 3A, 3B, 4B, 4C, 5, 6B, 6C, 7A, 7B, 8A and 8B.

The apparatus 10 can be any suitable shape, such as square (e.g., a cube with a side surface that is a square) as shown in FIG. 9A, rectangular cuboid (e.g., cuboid with a side surface that is a rectangle) as shown in FIG. 9B, cylindrical as shown in FIG. 9C, toroidal as shown in FIG. 9D, or any other suitable shape or combination of shapes.

Alternatively, the particles 30 can be individually stored in sealed in a plurality of chambers 50 (e.g., spherical chambers) packed and arranged in any desired symmetry pattern such as, concentric radial packing, hexagonal (staggered), packing randomly packed, or square packing. Alternatively, the particles 30 can be stored any combination of symmetry or non-symmetry patterns as desired.

Figure 2B:
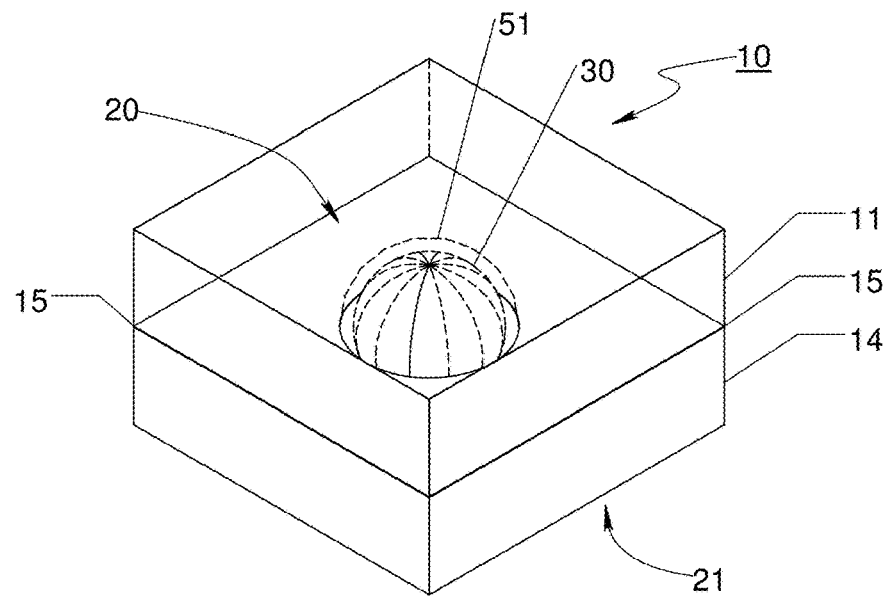
FIG. 2B is a perspective view of a sealed version of FIG. 2A.
Figure 2D:
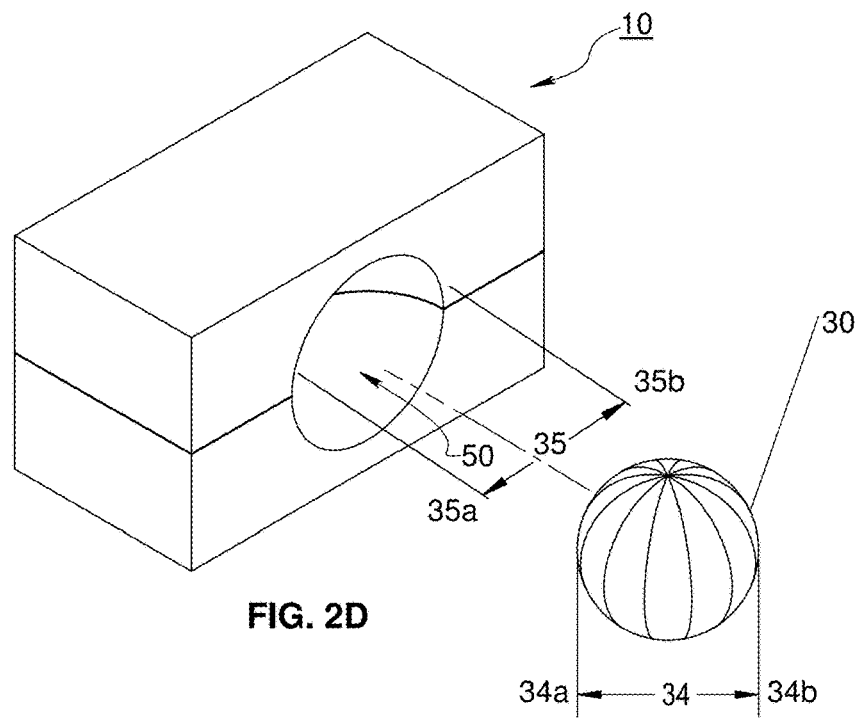
FIG. 2D is a cross-sectional view that shows the diameter of a single chamber and the diameter of a single particle.
Figure 2E:
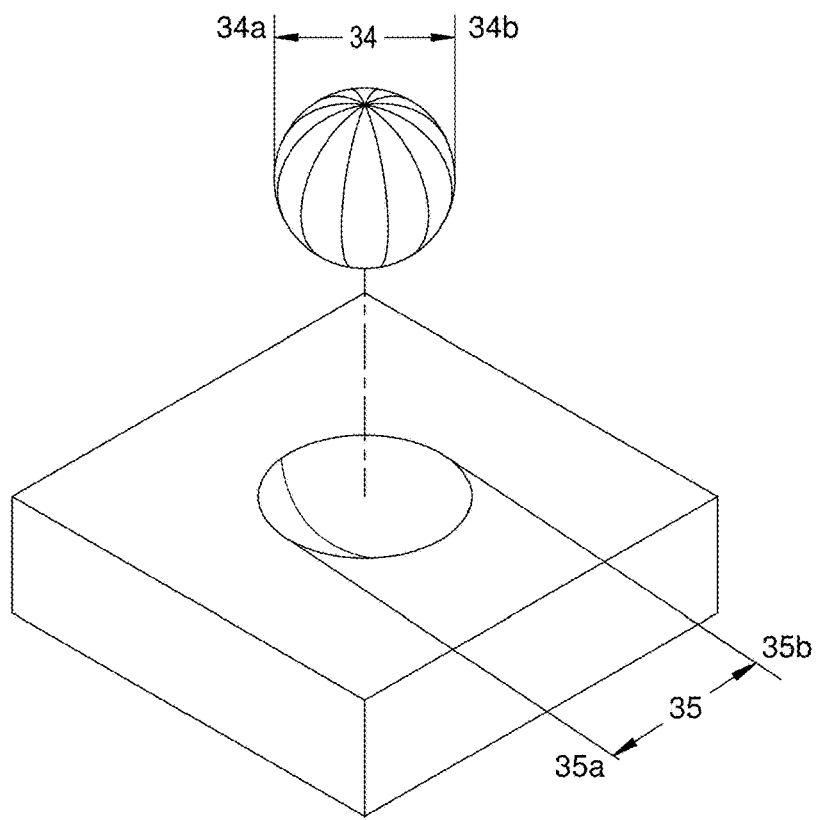
FIG. 2E is a perspective view of another embodiment of the apparatus of FIG. 2D.
Figure 4A:
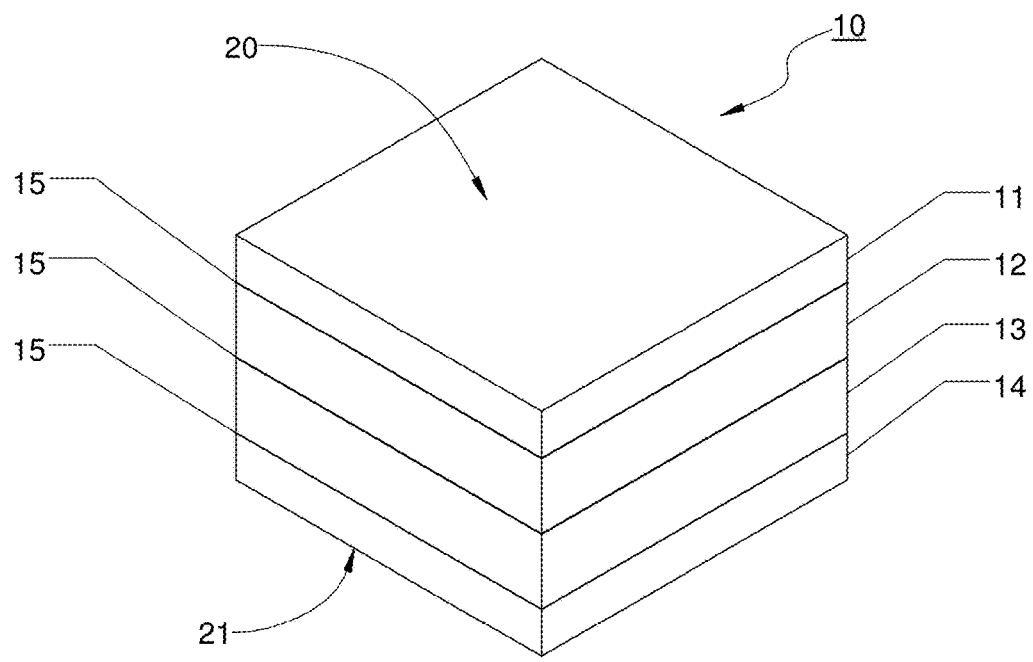
FIG. 4A is a perspective view of another embodiment of the PID of FIG. 2B with a plurality of spherical chambers constructed of a plurality of sections.
Figure 4B:
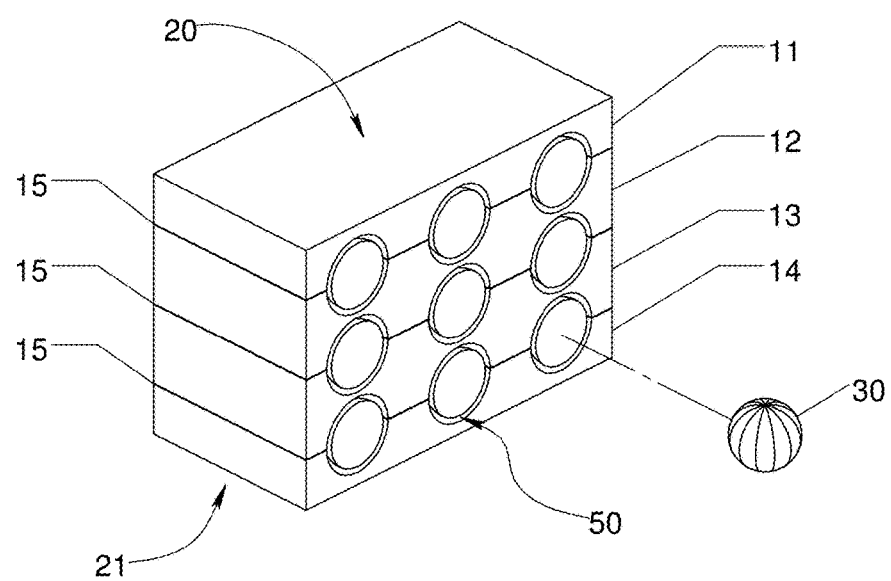
FIG. 4B is a cross-sectional view of the apparatus of FIG. 4A.
Figure 4C:
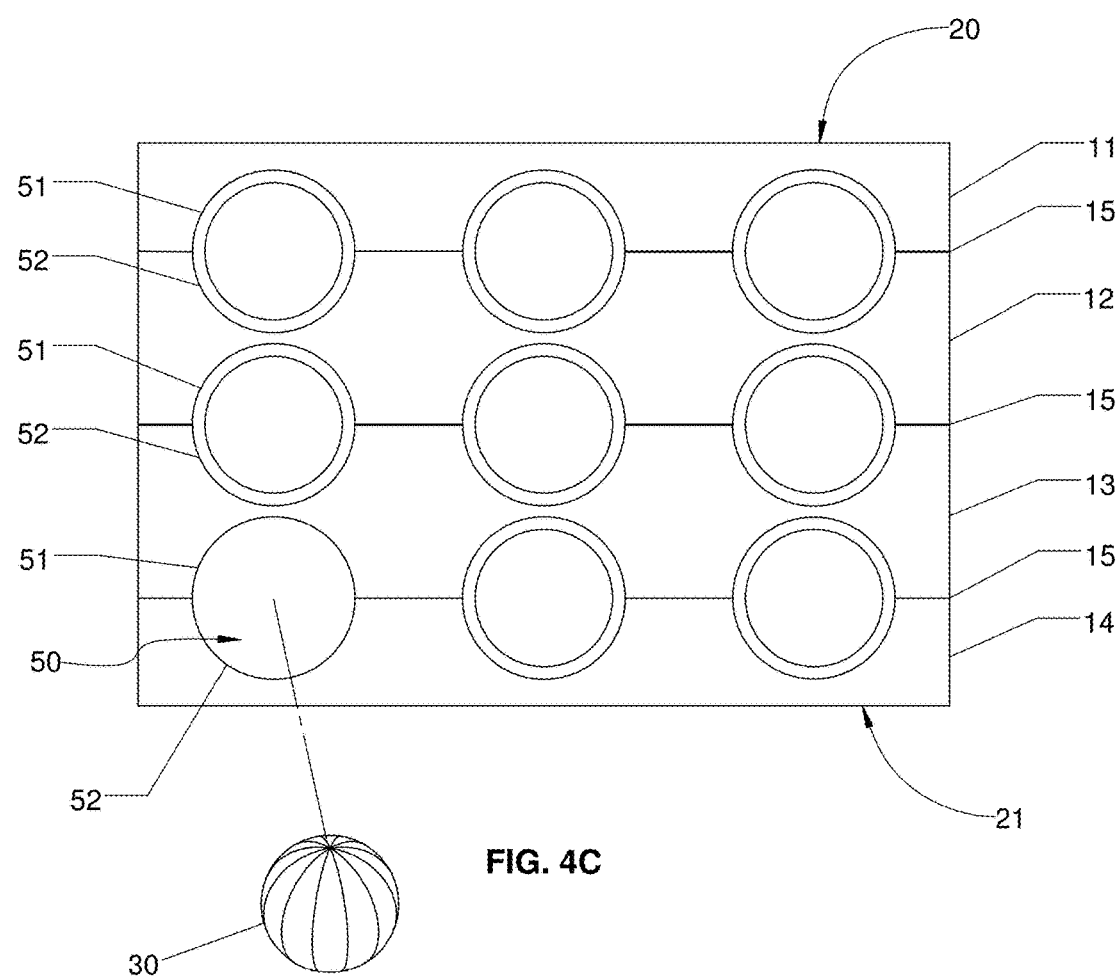
FIG. 4C is a front facing sectional view of the apparatus of FIG. 4B.

The PID 10 can optionally be a single particle 30 in a single chamber 50, of two-piece construction with a top plate 11 and a bottom plate 14 shown in FIGS. 2A, 2B and 2C. Top plate 11 can be coupled to bottom plate 14 by adhesive, prepreg, fasteners or other suitable mechanism (e.g., welds) 15.

The two-piece construction PID 10 can optionally have a plurality of sealed chambers 50 (e.g., spherical chambers) shown in FIGS. 3A and 3B.

Figure 7A:
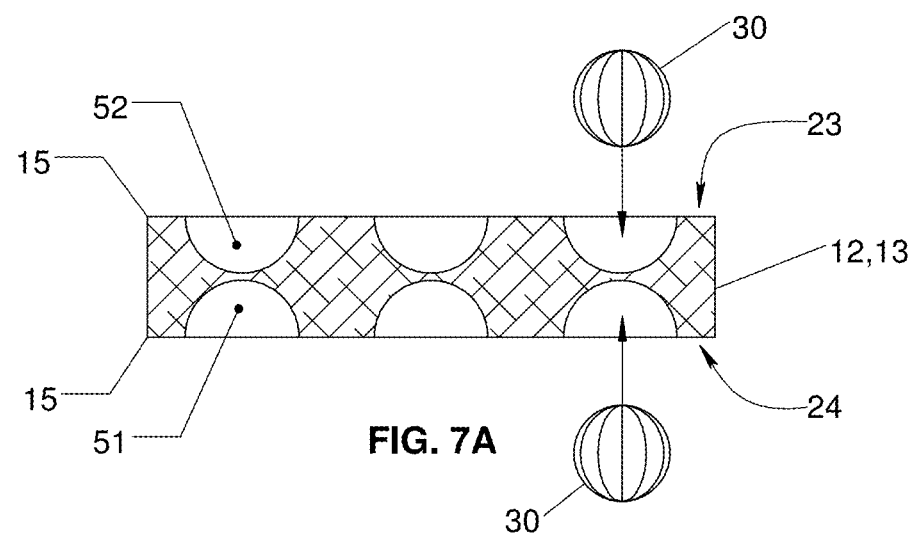
FIG. 7A is a front facing sectional view of an inner (middle) layer section of apparatus of FIG. 4A.
Figure 7B:
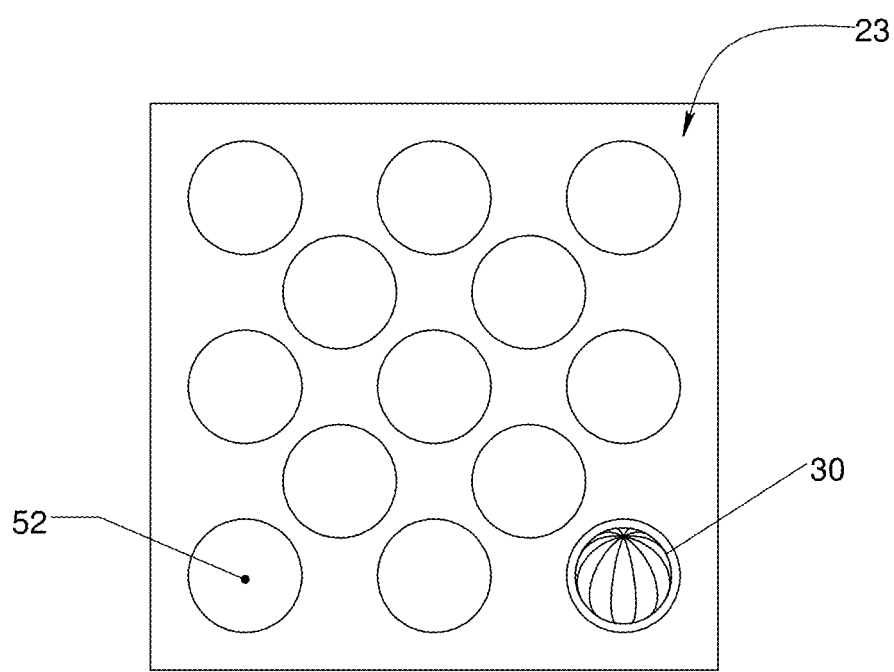
FIG. 7B is a top view of the apparatus of FIG. 7A.

Optionally, PID 10 can be constructed of three or more pieces shown in FIGS. 4A, 4B, 4C and 5 with top plate 11 and bottom plate 14 coupled to middle plates 12 and 13 (or more middle plates as desired). Alternatively, one or both of middle plates 12 and 13 (or more middle plates as desired) can be formed from a single piece (e.g., monolithic, with no seams) as shown in FIGS. 7A and 7B.

Exploded view FIG. 5 shows a top plate 11 and bottom plate 14 with two middle plates 12 and 13. Additional middle plates 12 and/or 13 can be added as preferred.

The top plate 11 shown in FIGS. 2A, 2B, 2C, 3A, 3B, 4A, 4B, 4C, 5 and 6B can have a top surface 20 shown in FIGS. 2A, 2B, 2C, 3A, 3B, 4A, 4B, 4C, 5, 6A, 6B, 9A, 9B, 9C and 9D that is optionally planar (e.g., flat). Alternatively, the top surface of 11 can be any shape desired.

The bottom plate 14 shown in FIGS. 2A, 2B, 2C, 3A, 3B, 4A, 4B, 4C, 5 and 8B can have a bottom surface 21 shown in FIGS. 2A, 2B, 2C, 3A, 3B, 4A, 4B, 4C, 5, 8B and 8C that is optionally planar (e.g., flat). Alternatively, the bottom surface of 14 can be any shape desired.

The bottom side 22 shown in FIGS. 6B and 6C of top plate 11 is optionally coupled to surface 23 shown in FIGS. 7A and 7B of middle plate 12 by adhesive, prepreg, fasteners or other suitable mechanism (e.g., welds) 15 shown in FIGS. 2A, 2B, 2C, 3A, 3B, 4A, 4B, 4C, 5, 7A and 8B.

The bottom surface 24 of middle plate 12 and/or 13 (or optionally additional middle plates, as desired) is shown in FIG. 7A. Middle plate 12 and/or 13, shown in FIGS. 4A, 4B, 4C, 5 and 7A, is optionally planar (e.g., flat) or any shape as desired. The surface of middle plate 12 can be parallel to the middle plate 13 shown in FIGS. 4A, 4B, 4C and 5. Middle plate 12 can be coupled to middle plate 13 by adhesive, prepreg, fasteners or other suitable mechanism (e.g., welds) 15.

Figure 8A:
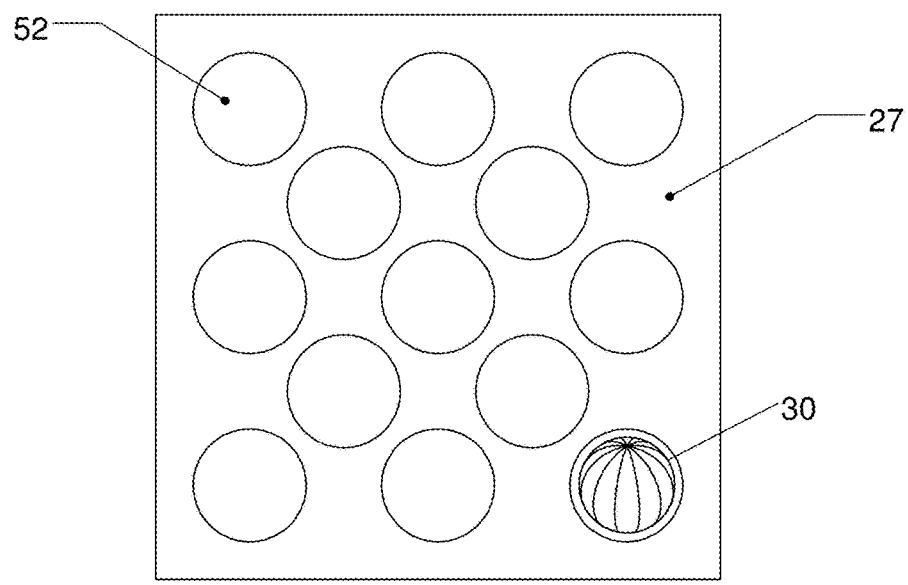
FIG. 8A is a top view of the bottom section of the apparatus of FIG. 4A.
Figure 8B:
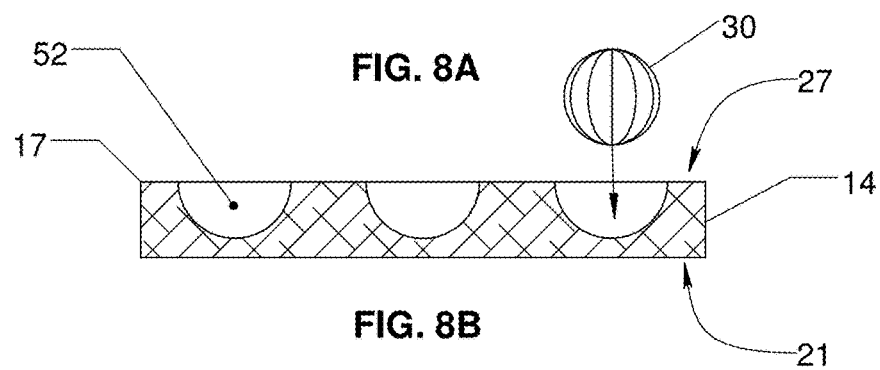
FIG. 8B is a front facing sectional view of the apparatus of FIG. 8A.
Figure 8C:
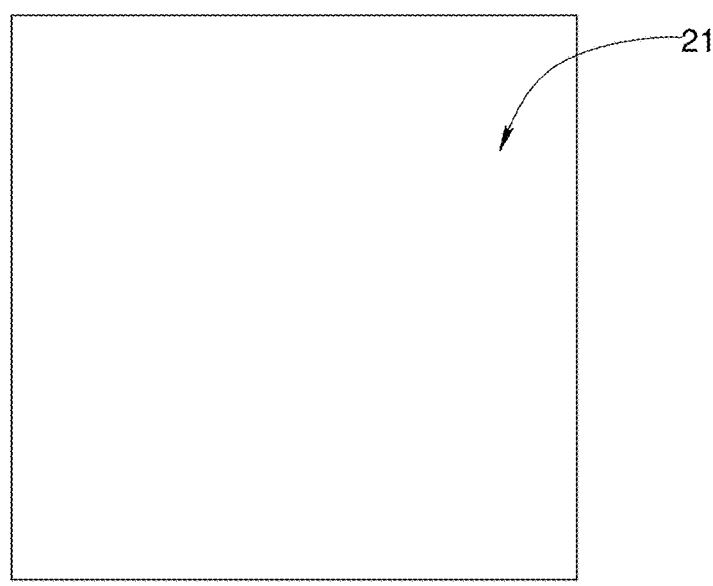
FIG. 8C is a bottom view of the apparatus of FIG. 8A.

The top surface 27 shown in FIGS. 8A and 8B of bottom plate 14 is optionally planar (e.g., flat). The bottom surface 24 of middle plate(s) 12 and/or 13 can be parallel to the bottom plate 14 coupled by adhesive, prepreg, fasteners or other suitable mechanism (e.g., welds) 15. Alternatively, the surface of 27 can be any shape desired.

One embodiment of a single spherical storage chamber 50 is formed by a semispherical northern hemisphere (e.g. top surface) outline 51 in FIGS. 2A, 2B and 2C and a semispherical southern hemisphere (e.g., bottom surface) outline 52 shown in FIGS. 2A and 2C connected by adhesive, prepreg, fasteners or other suitable mechanism (e.g., welds) 15. The spherical storage chamber 50 can optionally be filled with air in addition to one particle (e.g., tungsten ball) 30. Alternatively, the spherical storage chamber 50 can be under vacuum. In another alternative, the storage chamber 50 can be filled with another gas, such as an inert gas.

Another embodiment of a plurality of storage chambers (e.g., spherical storage chambers) 50 is formed by a surface of a semispherical northern hemisphere outline 51 shown in FIGS. 3A, 4C, 5, 6B, 6C and 7A and a surface of a semispherical southern hemisphere outline 52 shown in FIGS. 3A, 4B, 4C, 5, 7A, 7B, 8A and 8B. The spherical chambers are formed by connecting plates 11 to 12 by welds 15 and connecting plates 12 to 13 by welds 15 and connection plates 13 to 14 by welds 15 (and so forth as desired) with adhesive, prepreg, fasteners or other suitable mechanism (e.g., welds). The plurality of storage chambers 50 can optionally be filled with air in addition to one particle (e.g., tungsten ball) 30. Alternatively, the storage chambers 50 can be under vacuum. In another alternative, the storage chambers 50 can be filled with another gas, such as an inert gas.

Optionally, the PID apparatus 10 has a particle (e.g. ball or sphere) 30 having a diameter that is smaller than a diameter of the chamber 50.

Optionally, the particle 30 (e.g., tungsten ball) has unrestricted 360 degree omnidirectional movement 31 inside the spherical chamber 50 as shown in FIG. 2A.

In another embodiment of the PID apparatus 10, the particle(s) 30 (e.g., spheres or balls of tungsten or other material) have unrestricted freedom of movement during any orientation, roll, pitch, yaw, attitude or position that the spherical chamber(s) 50 are positioned in.

The distance that the particle 30 (e.g., spheres or balls of tungsten or other material) can travel inside spherical chamber 50 is determined by the gap (e.g., spacing) between the outer surface of particle 30 and the inner surface wall of spherical chamber 50.

The preferred diameter of the spherical chamber 50 is at least 7% larger than the diameter of the particle 30 (e.g., spheres or balls of tungsten or other material). However the diameter of the spherical chamber can be adjusted between 7% and 25% larger than the particle 30, as desired. However, in other embodiments, the diameter of the chamber 50 can be less than 7% larger than the diameter of the particle 30 (e.g., about 6%, 5%, 4%, 3% larger).

In the preferred embodiment of the PID apparatus 10, the particle 30 (e.g., spheres or balls of tungsten or other material) will strike the curved inside walls of spherical storage chamber 50 at the instance of a vibrational event (e.g. physical movement).

The response time from the instance of a vibrational event (e.g. physical movement) that the particle 30 (e.g., sphere or ball of tungsten or other material) in the PID 10 to a strike against the curved walls of spherical storage chamber 50 is determined by the gap distance (e.g. spacing) between the surface of the particle 30 and the surface wall of spherical chamber 50.

In the preferred embodiment of the PID apparatus 10, the response time for the particle 30 (e.g., sphere or ball of tungsten or other material) to strike the surface wall of the spherical chamber 50 is increased as the size of the spherical storage chamber 50 becomes larger in relation to the size tungsten ball 30. The response time for the particle 30 (e.g., sphere or ball of tungsten or other material) to strike the surface of wall of the spherical chamber 50 is decreased as the size of the spherical storage chamber 50 becomes smaller in relation to the size tungsten ball 30.

Optionally, the response time of the PID apparatus 10 can be adjusted by increasing or decreasing the size of the spherical storage chamber 50 in relation to the size of the tungsten ball 30.

In the preferred embodiment of the PID apparatus 10, the particle 30 (e.g., sphere or ball of tungsten or other material) can escape gravity when the PID apparatus 10 is coupled to the surface of a PCB board (or other planar surface as discussed above) and is subjected to an acceleration of at least 1 G (e.g. gravitational G-force associated with an object relative to free-fall) and in doing so, the particle 30 can become airborne inside the spherical storage chamber 50 in the gap area between the outer surface of the particle 30 and the inner walls of the storage chamber 50.

Optionally, none of the particles 30 (e.g., spheres or balls of tungsten or other material) in the PID apparatus 10 are weighed down or constrained by the mass of another particle 30 as observed in the prior art. Accordingly, the PID 10 advantageously provides a quicker response time for the particles 10 (e.g., spheres or balls of tungsten or other material) to strike the walls of the storage chamber 50 upon the instantaneous onset of a vibrational response, thereby providing a PID 10 with a faster vibration response that advantageously can dissipate vibration forces more quickly than existing PIDs.

The particle(s) 30 (e.g., spheres or balls of tungsten or other material) will strike the curved inside walls of spherical storage chamber(s) 50 in the opposite direction of the movement (e.g. bending) of the PCB board according to Newton's third law: For every action, there is an equal and opposite reaction.

In the PID apparatus 10, the collective momentum of a plurality of particles 30 (e.g., spheres or balls of tungsten or other material) will optionally strike the curved inside walls of a plurality of spherical storage chambers 50 with sufficient force as to dampen the flexible movement (e.g., bending) when the PID apparatus 10 is coupled to the surface of the PCB or other planar surface.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

What is claimed is:

1. A particle impact damper for use with printed circuit boards, comprising:

a housing having one or more separate spherically shaped chambers, each spherically shaped chamber defined by one or more curved surfaces that surround an open cavity of the chamber;

one or more particles, each particle disposed in one of the one or more the spherically shaped chambers, the spherically shaped chamber having a diameter that is at least 7% larger than a diameter of the particle, wherein the one or more particles are configured to move unconstrained within the one or more spherically shaped chambers to contact the one or more curved surfaces to dampen a vibration force applied to the particle impact damper or a component attached to the particle impact damper.

2. The particle impact damper of claim 1, wherein the one or more particles is a plurality of particles and the one or more spherically shaped chambers is a plurality of spherically shaped chambers, each of the particles being individually housed in one of the plurality of spherically shaped particles.

3. The particle impact damper of claim 2, wherein the plurality of spherically shaped chambers are aligned in a single row.

4. The particle impact damper of claim 2, wherein the plurality of spherically shaped chambers are stacked in a plurality of rows.

5. The particle impact damper of claim 2, wherein the plurality of spherically shaped chambers are arranged in symmetrical or asymmetrical packing patterns.

6. The particle impact damper of claim 1, wherein the housing has one of a cube shape, a rectangular cuboid shape, a toroidal shape, and a cylindrical shape.

7. The particle impact damper of claim 1, wherein the housing comprises one of a plastic, a ceramic, and a metal material.

8. The particle impact damper of claim 1, wherein the particles comprise one of a metal, a plastic, a liquid or a powder.

9. The particle impact damper of claim 8, wherein the one or more particles comprise a tungsten material.

10. A particle impact damper, in combination with a printed circuit board, comprising:

a housing defining a plurality of separate storage chambers therein;

a plurality of spherical particles, each spherical particle disposed and configured to move within one of the plurality of storage chambers;

wherein an effective diameter of each of the storage chambers is greater than an effective diameter of the spherical particle disposed in the storage chamber to thereby provide a damping performance of the particle impact damper on the printed circuit board.

11. The combination of claim 10, wherein the housing has one of a cube shape, a rectangular cuboid shape, a toroidal shape, and a cylindrical shape.

12. The combination of claim 10, wherein said plurality of storage chambers are spherically shaped.

13. The combination of claim 10, wherein the plurality of storage chambers is arranged in one or more stacked rows.

14. The combination of claim 10, wherein said storage chambers are arranged in symmetrical or asymmetrical packing patterns.

15. The combination of claim 10, wherein the housing comprises one of a plastic, a ceramic, and a metal material.

16. The particle impact damper of claim 10, wherein the particles comprise one of a metal, a plastic, a liquid or a powder.

17. The combination of claim 10, wherein the one or more chambers has an effective diameter at least 7% larger than an effective diameter of the spherical particle.

18. The combination of claim 10, wherein the plurality of spherical particles comprise tungsten.

19. The combination of claim 10, wherein the housing comprises a top plate, a middle plate and a bottom plate coupleable to each other to define the housing, at least one of the storage chambers defined at least in part by a cavity in the middle plate.

20. The combination of claim 10, wherein the printed circuit board assembly comprises a planar surface on which the particle impact damper is mounted.

21. The combination of claim 10, wherein the collective mass of the plurality of spherical particles is greater than 7% of the combined mass of the printed circuit board assembly populated with components.

* * * * *

UNITED STATES PATENT AND TRADEMARK OFFICE
CERTIFICATE OF CORRECTION

PATENT NO. : 10,021,779 B1  
APPLICATION NO. : 15/824915  
DATED : July 10, 2018  
INVENTOR(S) : Martin B. Hart Page 1 of 1

It is certified that error appears in the above-identified patent and that said Letters Patent is hereby corrected as shown below:

In the Claims

On Column 10, Line 6: In Claim 1, after "more" insert --of--.

Signed and Sealed this
Ninth Day of October, 2018

Andrei Iancu
*Director of the United States Patent and Trademark Office*